US012080936B2

(12) United States Patent
Buckley et al.

(10) Patent No.: US 12,080,936 B2
(45) Date of Patent: Sep. 3, 2024

(54) CAVITY RESONANCE SUPPRESSION USING THERMAL PEDESTAL ARRANGEMENTS IN ACTIVE ELECTRONICALLY SCANNED ARRAY

(71) Applicant: Hughes Network Systems, LLC, Germantown, MD (US)

(72) Inventors: Michael Buckley, Boyds, MD (US); Tom Walter, Germantown, MD (US); Lal Mohan Bhowmik, Montogomery Village, MD (US); Varada Rajan Komanduri, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 273 days.

(21) Appl. No.: 17/657,342

(22) Filed: Mar. 30, 2022

(65) Prior Publication Data

US 2022/0320705 A1 Oct. 6, 2022

Related U.S. Application Data

(60) Provisional application No. 63/266,262, filed on Dec. 30, 2021, provisional application No. 63/169,770, filed on Apr. 1, 2021.

(51) Int. Cl.

*H01Q 1/02* (2006.01)
*H01Q 1/24* (2006.01)
(Continued)

(52) U.S. Cl.

CPC ................ *H01Q 1/02* (2013.01); *H01Q 1/24* (2013.01); *H01Q 1/42* (2013.01); *H01Q 3/36* (2013.01);
(Continued)

(58) Field of Classification Search

CPC .. H01Q 1/02; H01Q 1/24; H01Q 3/36; H05K 1/0203; H05K 2201/10098; H04B 15/00
(Continued)

(56) References Cited

U.S. PATENT DOCUMENTS 7,671,696 B1 * 3/2010 Puzzella ............. H01Q 21/0087 333/260
10,319,700 B1 6/2019 Burton
(Continued)

FOREIGN PATENT DOCUMENTS

EP 3188229 A1 7/2017
WO 2010116357 A1 10/2010

OTHER PUBLICATIONS

International search report for PCT application No. PCT/US2022/071452.

(Continued)

*Primary Examiner* — Hai V Tran
(74) *Attorney, Agent, or Firm* — Capitol City TechLaw; Jasbir Singh

(57) ABSTRACT

An AESA (Active Electronically Scanned Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; and a TIM (Thermal Interface Material), having a TIM height, disposed between a respective contact surface of the thermal pedestals and the obverse surface. A plurality of the thermal pedestals are physically interconnected, the TIM is electrically and thermally conductive, and the wall height plus the TIM height is sufficient to suppress resonances of the TRMs below a frequency greater than a Tx and Rx frequency band of the TRMs.

20 Claims, 2 Drawing Sheets

300
302
304
306
308
310
312
310
312
310
318
314
316

(51) Int. Cl.
*H01Q 1/42* (2006.01)
*H01Q 3/36* (2006.01)
*H04B 15/00* (2006.01)
*H05K 1/02* (2006.01)

(52) U.S. Cl.
CPC ........... *H04B 15/00* (2013.01); *H05K 1/0203* (2013.01); *H05K 2201/10098* (2013.01)

(58) Field of Classification Search
USPC .......................................................... 343/904
See application file for complete search history.

(56) References Cited

U.S. PATENT DOCUMENTS

| | | | | |
|---|---|---|---|---|
| 2004/0020634 | A1 | 2/2004 | Boudreaux et al. | |
| 2004/0212964 | A1 | 10/2004 | Belady et al. | |
| 2010/0157531 | A1 | 6/2010 | Mason et al. | |
| 2011/0075377 | A1 | 3/2011 | Paquette et al. | |
| 2012/0063094 | A1* | 3/2012 | Gaynes | H05K 3/30 29/831 |
| 2014/0299980 | A1* | 10/2014 | Choi | H01L 23/481 257/698 |
| 2017/0099726 | A1 | 4/2017 | Elliott et al. | |
| 2017/0229368 | A1* | 8/2017 | Chiu | H01L 23/055 |
| 2017/0250120 | A1 | 8/2017 | Harauchi et al. | |
| 2017/0346185 | A1* | 11/2017 | Wang | H01Q 1/2283 |
| 2018/0090467 | A1* | 3/2018 | Kim | H01L 25/18 |
| 2018/0316096 | A1 | 11/2018 | Harauchi | |
| 2019/0109101 | A1 | 4/2019 | Menon et al. | |
| 2019/0319338 | A1* | 10/2019 | Gu | H01L 22/32 |
| 2020/0359506 | A1 | 11/2020 | Bedinger | |
| 2021/0013178 | A1 | 1/2021 | Nakanishi et al. | |
| 2022/0320705 | A1 | 10/2022 | Buckley et al. | |
| 2023/0051507 | A1 | 2/2023 | Gao et al. | |

OTHER PUBLICATIONS

U.S. Appl. No. 63/169,770, filed Apr. 1, 2021, Michael Buckley.
International Search Report for PCT Application No. PCT/US2022/071453.

* cited by examiner

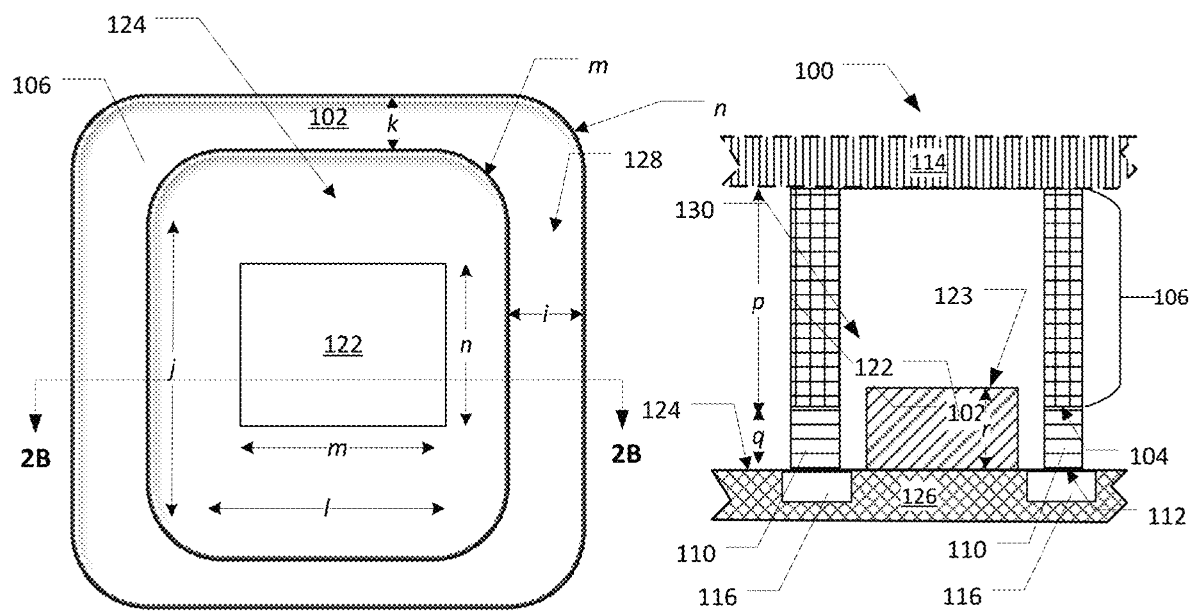
FIG. 1A
FIG. 1B
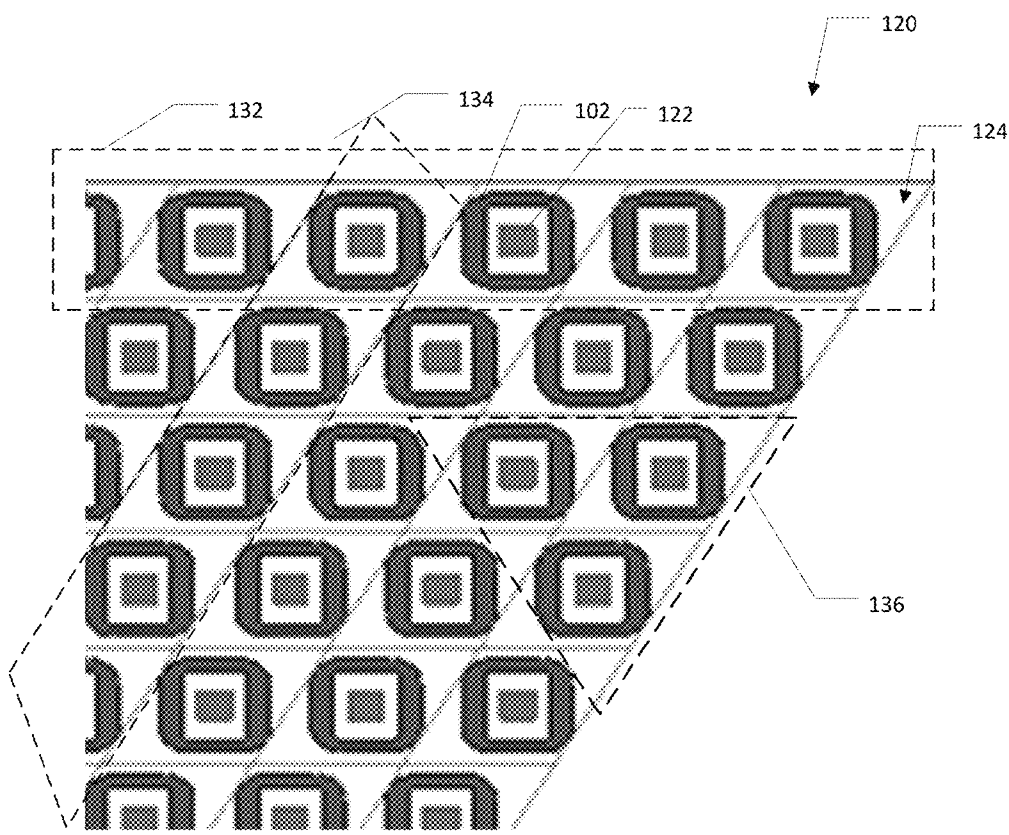
FIG. 1C

CAVITY RESONANCE SUPPRESSION USING THERMAL PEDESTAL ARRANGEMENTS IN ACTIVE ELECTRONICALLY SCANNED ARRAY

CROSS-REFERENCE TO RELATED APPLICATIONS AND INCORPORATION BY REFERENCE

The present application claims the benefit under 35 U.S.C. 119(e) of U.S. Provisional Application Ser. No. 63/169,770, filed Apr. 1, 2021, and U.S. Provisional Application Ser. No. 63/266,262, filed Dec. 30, 2021, all of which are incorporated herein by reference in their entireties.

FIELD

A low-cost easy to manufacture solution to address thermal, EMI (Electro-Magnetic Interference), volume and location requirements for an AESA (Active Electronically Scanned Array) is presented. The AESA includes passive thermal pedestals interspersed in an arrangement with the AESA active devices. The thermal pedestals are electrically and thermally conductive. The AESA may be used in satellite communications and radar systems.

BACKGROUND

The prior art uses a combination of thermal pedestals, EMI gasketing material, and EMI ground tape to address the thermal, EMI, and AESA active device placement requirements. The manufacture of the prior art is relatively more expensive and has relatively more fabrication complexity. Moreover, the reliability of the EMI ground tape is questionable.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

The present teachings provide a low-cost easy to manufacture solution to address thermal, EMI (Electro-Magnetic Interference), volume and location requirements for an AESA (Active Electronically Scanned Array). The AESA thermal pedestals meet the EMI performance requirements by suppressing cavity resonances of the AESA below a frequency greater than the Rx and Tx frequency bands of the AESA. For example, when the upper limit of the RX and TX frequency bands is 14.5 GHz, resonances below 15.5, 16.5, 17.5 or the like GHz are suppressed. The present teachings are applicable to RF (Radio Frequency) communication systems, for example, RF communications via LEO (Low Earth Orbit), MEO (Medium Earth Orbit) or GEO (Geosynchronous Earth Orbit) satellites and radar systems.

An AESA (Active Electronically Scammed Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; and a TIM (Thermal Interface Material), having a TIM height, disposed between a respective contact surface of the thermal pedestals and the obverse surface. A plurality of the thermal pedestals are physically interconnected, the TIM is electrically and thermally conductive, and the wall height plus the TIM height is sufficient to suppress resonances of the TRMs below a frequency greater than a Tx and Rx frequency band of the TRMs.

The AESA may include a heat sink, wherein the thermal pedestals extend from the heat sink.

The AESA may include fins extending from a first surface of the heat sink, where the thermal pedestals extend from a second surface of the heat sink different than the first surface of the heat.

The AESA where the heat sink, the fins and the thermal pedestals are of a unitary, one-piece construction made, for example, from a metal casting process.

The AESA may include a ground layer disposed in the PCB and in contact with the TIM.

The AESA where the arrangement of the thermal pedestals is shaped as a waffle pattern.

The AESA where the thermal pedestals are organized with substantial bilateral symmetry along both a first axis and a second axis orthogonal to the first axis.

The AESA where the TRMs are disposed in a non-equilateral triangular lattice, an equilateral triangular lattice, a rectangular lattice, or an aperiodic lattice.

The AESA may include antenna elements and a radome layer disposed over a reverse surface of the PCB.

The AESA may include a polarizer integrated with the radome.

The AESA where the thermal pedestals, the TIM and the PCB together form a stack having a cross-section depth less than or equal to 100 mils (2.54 millimeter).

The AESA where the thermal pedestals are of a unitary, one-piece construction.

The AESA where a thermal pedestal encircles, without contacting, a respective one of the TRMs.

The AESA where the interconnecting includes a web interconnecting a plurality of the thermal pedestals.

The AESA where the AESA is configured to operate in Ku and X frequency bands.

The AESA where the upper limit of the Tx and Rx frequency bands is less than or equal to 14.5 GHz and the suppressed resonances are less than equal to 16 GHz.

The AESA is configured to operate with a scan angle $\theta$ from 0° to 45° and a $\varphi$ scan angle from 0° and 360°.

The AESA is configured to operate with an upper end of the Tx and Rx frequency bands less than or equal to 14.5 GHz with a scan angle $\theta$ from 0° to 45° and a $\varphi$ scan angle from $0° \leq \varphi \leq 360°$.

An AESA (Active Electronic Scanned Array), including: a PCB (Printed Circuit Board) substrate having an obverse surface; TRMs (Transmit/Receive Modules) disposed on the obverse surface; thermal pedestals wherein each thermal pedestal includes a wall, having a wall height, including wall surfaces and one of the wall surfaces being a contact surface; a TIM (Thermal Interface Material), having a TIM height, disposed between a respective contact surface of the thermal pedestals and the obverse surface; and a heat sink including fins. In the AESA, a plurality of the thermal pedestals are physically interconnected, and the TIM is electrically and thermally conductive, the wall height plus the TIM height is sufficient to suppress resonances of the TRMs below a frequency greater than the Tx and Rx frequency bands of the TRMs. In the AESA, the fins extend from a first surface of the heat sink and the thermal pedestals extend from a second surface of the heat sink different than the first surface of the heat. In the AESA, the heat sink, the fins and the thermal pedestals are of a unitary, one-piece construction, and the AESA is configured to operate with an upper limit of the Tx and Rx frequency bands of less than or equal to 14.5 GHz with a scan angle θ from 0° to 45° and a φ scan angle from 0°≤φ≤360°.

Additional features will be set forth in the description that follows, and in part will be apparent from the description, or may be learned by practice of what is described.

DRAWINGS

In order to describe the manner in which the above-recited and other advantages and features may be obtained, a more particular description is provided below and will be rendered by reference to specific embodiments thereof which are illustrated in the appended drawings. Understanding that these drawings depict only typical embodiments and are not, therefore, to be limiting of its scope, implementations will be described and explained with additional specificity and detail with the accompanying drawings.

FIG. 1A illustrates a top view of an exemplary thermal pedestal according to various embodiments.

FIG. 1B illustrates a cross-sectional view of an exemplary thermal pedestal arrangement according to various embodiments.

FIG. 1C illustrates a top view of an exemplary thermal pedestal arrangement.

Figures 2, 3:
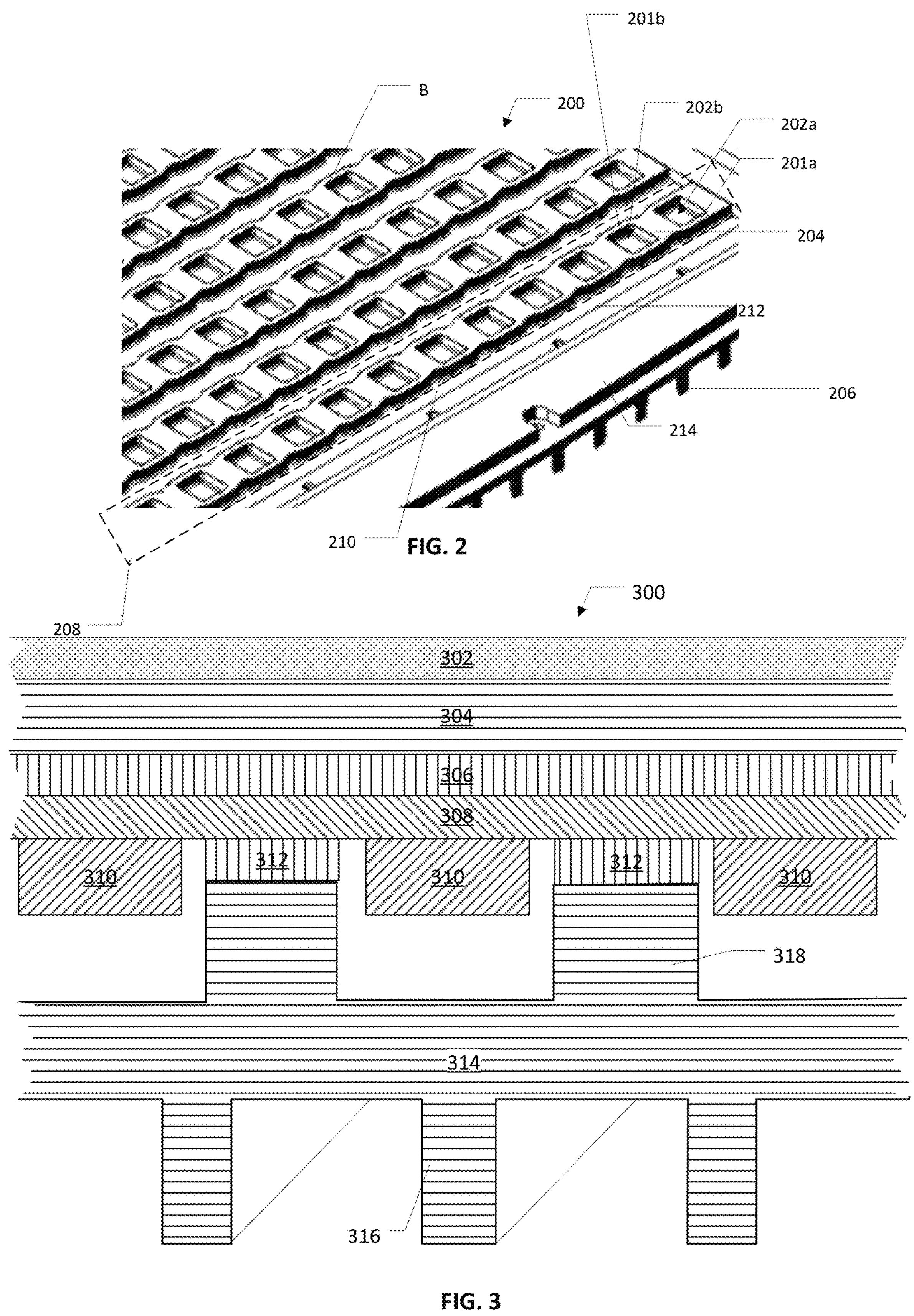
FIG. 2 illustrates a top view of a heat sink including thermal pedestals according to various embodiments.
FIG. 3 illustrates a cross-sectional view of an AESA according to various embodiments.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Embodiments are discussed in detail below. While specific implementations are discussed, this is done for illustration purposes only. A person skilled in the relevant art will recognize that other components and configurations may be used without parting from the spirit and scope of the subject matter of this disclosure.

The terminology used herein is for describing embodiments only and is not intended to be limiting of the present disclosure. As used herein, the singular forms “a,” “an” and “the” are intended to include the plural forms as well, unless the context clearly indicates otherwise. Furthermore, the use of the terms “a,” “an,” etc. does not denote a limitation of quantity but rather denotes the presence of at least one of the referenced items. The use of the terms “first,” “second,” and the like does not imply any order, but they are included to either identify individual elements or to distinguish one element from another. It will be further understood that the terms “comprises” and/or “comprising”, or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof. Although some features may be described with respect to individual exemplary embodiments, aspects need not be limited thereto such that features from one or more exemplary embodiments may be combinable with other features from one or more exemplary embodiments.

A low-cost solution to address thermal, electromagnetic interference (EMI), and AESA active device volume and location requirements is disclosed. Thermal pedestals are a passive means to remove heat generated by active devices of the AESA. The active devices may include an TRM or the like.

Thermal pedestals conduct the heat from the surface of a printed circuit board to a metal surface enclosing an AESA cavity. The thermal pedestals may serve as electromagnetic grounding vias. The EMI requirements may be addressed by placing the thermal pedestals in an arrangement throughout the AESA cavity. The density of the thermals suppresses in-band resonances in the AESA cavity and removes heat. The resonance and heat removal allow for safe operation of the AESA. The arrangement of the thermal pedestals leaves adequate room to place the AESA active device. In some embodiments, the AESA active devices may be placed per a Triangular shape AESA geometrical arrangement.

The present teachings provide a very low-cost approach that is easy to fabricate into the AESA. An AESA's in band cavity resonance may be suppressed without sacrificing the system performance. The AESA may be used in RF communication systems including LEO and MEO satellite systems, and GEO satellite systems with mobile or small form factor user terminals and in radar system.

FIG. 1A illustrates a top view of an exemplary thermal pedestal according to various embodiments.

A thermal pedestal 102 may include a wall 106 shaped as a polygon, for example, a closed polygon, including a void 130 (See FIG. 1B) therein. A width of the wall 106 may vary over its length. A TRM 122 may be encircled or ringed by the wall 106. The TRM 122 may be disposed in the void 130. Portions of the void 130 may provide an airgap extending from a surface 123 of the TRM 122 to a heat sink 114 (see FIG. 1B; heat sink 114 is not illustrated in FIG. 1A or FIG. 1C for clarity). The walls 106 may extend from the heat sink 114. At a contact surface 104, the wall 106 may contact a TIM 110 extending from the surface 124 of the PCB 126. The heat sink 114 and the wall 106 may be of a unitary, one-piece construction.

The wall 106 may include portions having a length j and a width i. The wall 106 may include portions having a length l and a width k. Widths of the wall 106 may range from 1 mm to 20 mm, for example, 80 mils, 160 mils. Lengths of the wall 106 may range from 1 mm to 20 mm, for example, 330 mils, 410 mils. The portions of the wall 106 may be connected by rounded corners or sharp corners. The rounded corners of the wall 106 may have an inner radius m and an outer radius n from 1 mm to 20 mm, for example, 40 mils, 230 mils. In some embodiments, the sharp corners of the wall 106 may be angled, for example, at a 90-degree angle.

FIG. 1B illustrates a cross-sectional view of an exemplary thermal pedestal arrangement according to various embodiments.

FIG. 1B illustrates a cross-sectional view of an exemplary thermal pedestal arrangement 100. The thermal pedestal arrangement 100 may include the thermal pedestal 102 and a TIM 110. The thermal pedestal 102 may include a contact surface 104 to affix the thermal pedestal 102 with the TIM 110. The TIM 110 may include a PCB contact surface 112 to affix the TIM 110 to a PCB 126 on a surface 124 of the PCB 126. The thermal pedestal 102 may have a wall height p. In exemplary embodiments, the wall height c may be from 1 mm to 20 mm, for example, 160 mils. The TIM 110 may be of a wall height q ranging from 5 mils to 100 mils (a mil is a unit of length equal to 0.001 inches or 0.0254 mm), for example, 5, 10, 11, 12, 13, 14, 15, 16, 17, 18 or 20 mils. The TRM 122 may have a wall height r ranging from 1 mm to 10 mm, for example, 40 mils.

The PCB 126 may include a ground wire (not shown) of the PCB 126 may be electrically connected to the TRMs 122. The PCB 126 may include an exposed ground wire 116 that corresponds to the TIM 110. The exposed ground wire 116 may electrically connect the TIM 110 to a ground. The thermal pedestals 102 may be electrically connected to the exposed ground wire 116 of the PCB 126 via the electrically conductive TIM 110. The thermal pedestals 102 may be thermally connected to the TRMs 122 via the PCB 126 and thermally conductive TIM 110. The TIM 110 may be of a unitary, single-body construction, for example, a sticker disposed on the PCB 126.

FIG. 1C illustrates a top view of an exemplary thermal pedestal arrangement.

An AESA 120 may include the PCB 126 including the surface 124. An arrangement, for example, a periodic arrangement, of thermal pedestals 102 may be interspersed with TRMs 122. The TIM 110 (not visible in FIG. 1C) may be disposed between the thermal pedestals 102 and the surface 124 of the PCB 126. Walls 106 of the thermal pedestals 102 may be arranged to encircle in a ring 128 (see FIG. 1A) one of the TRMs 122. The wall 106 encircling one of the TRMs 122 may be unfragmented or contiguous. Some of the thermal pedestals 102 may be arranged in a row 132. Some of the thermal pedestals may be arranged in a column 134. The row 132 may be orthogonal to the column 134 (for example, see FIG. 1C). The row 132 may be non-orthogonal to the column 134 to form a triangular grid 136 for/with the thermal pedestals and the TRMs. The triangular grid may form a non-equilateral triangle.

FIG. 2 illustrates a top view of a AESA including a heat sink and thermal pedestals according to various embodiments.

An AESA 200 may include a heat sink 214 and a series 208 of thermal pedestals. The heat sink 214 and the series 208 of thermal pedestals may be of a unibody, one-piece construction. Two thermal pedestals 201*a*, 201*b* of the series 208 may share a nominally width-wise wall 204. Thermal pedestals included in the series 208 may share a nominally length-wise wall 210 (a web 210) connecting the thermal pedestals of the series 208.

An Electrically Conductive Thermal Interface Material may be applied to the top of the heatsink thermal pedestals. The series 208 may be disposed on an obverse surface 212 of the heat sink 214. Fins 206 may be disposed on a reverse surface (not shown) of the heat sink 214. Antenna elements may be disposed on the reverse surface to correspond to the arrangements of the TRMs ringed by the thermal pedestals. The heat sink 214, the series 208 and the fins 206 may be of a unibody, one-piece construction. A PCB may be mounted to a perimeter ledge of the obverse surface 212 around a plurality of series of the thermal pedestals.

Individual "ringed" thermal pedestals may be tied together, for example, with a common "web" to improve manufacturability. Metal manufacturing processes such as casting (expendable or permanent mold casting), powder metallurgy, deformation, material removal, nontraditional (lasers, electron beams, chemical erosion, electric discharge and electrochemical energy), or joining and assembly may be used to form the thermal pedestals along with the heat sink and fins as desired.

The wall for the thermal pedestal may be unbroken when encircling or ringing the void. A ringed void may isolate the electromagnetic energy of a first TRM from the electromagnetic energy of a second TRM in an AESA. The wall may be shared between two or more thermal pedestals. Interconnected thermal pedestals share a fragment of their defining walls with one another. The defining walls may be a portion of web interconnecting a plurality of thermal pedestals.

FIG. 3 illustrates a cross-sectional view of an AESA according to various embodiments.

An AESA 300 may include a plurality of layers including a radome 302, a polarizer 304, an air gap 306, a PCB 308, and a heat sink 314. TRMs 310 may be disposed on the PCB 308. A TIM 312 may contact the PCB 308 and thermal pedestals 318. Thermal pedestals 318 may extend from a heat sink 314. Fins 316 may extend from the heat sink 314. Heat from the TRMs 310 may be exchanged (convectively) with an ambient environment via the heat sink 314. In some embodiments, the heat may be conducted from the TRMs 310 to the TIM 312 to the thermal pedestals 318 to the heat sink 314 to the fins 316. The heat sink 314 may be a heat sink.

Although the subject matter has been described in language specific to structural features and/or methodological acts, it is to be understood that the subject matter in the appended claims is not necessarily limited to the specific features or acts described above. Rather, the specific features and acts described above are disclosed as example forms of implementing the claims. Other configurations of the described embodiments are part of the scope of this disclosure. Further, implementations consistent with the subject matter of this disclosure may have more or fewer acts than as described or may implement acts in a different order than as shown. Accordingly, the appended claims and their legal equivalents should only define the invention, rather than any specific examples given.

We claim:

1. An AESA (Active Electronically Scanned Array) comprising:

a PCB (Printed Circuit Board) substrate having an obverse surface;

TRMs (Transmit/Receive Modules) disposed on the obverse surface;

thermal pedestals wherein each thermal pedestal comprises a wall, having a wall height, comprising wall surfaces and one of the wall surfaces being a contact surface; and a TIM (Thermal Interface Material), having a TIM height, disposed between a respective contact surface of the thermal pedestals and the obverse surface, wherein a plurality of the thermal pedestals is physically interconnected, the TIM is electrically and thermally conductive, and the wall height plus the TIM height are sufficient to suppress resonances of the TRMs below a frequency greater than a Tx/Rx frequency band of the TRMs.

2. The AESA of claim 1, further comprising a heat sink, wherein the thermal pedestals extend from the heat sink.

3. The AESA of claim 2, further comprising fins extending from a first surface of the heat sink, wherein the thermal pedestals extend from a second surface of the heat sink different than the first surface of the heat sink.

4. The AESA of claim 3, wherein the heat sink, the fins and the thermal pedestals are of a unitary, one-piece construction.

5. The AESA of claim 3, wherein the heat sink, the fins and the thermal pedestals are of a unitary, one-piece construction made by a metal casting process.

6. The AESA of claim 1, further comprising a ground layer disposed in the PCB and in contact with the TIM.

7. The AESA of claim 1, wherein the arrangement is shaped as a waffle pattern.

8. The AESA of claim 1, wherein the thermal pedestals are organized with substantial bilateral symmetry along both a first axis and a second axis orthogonal to the first axis.

9. The AESA of claim 1, wherein the TRMs are disposed in a non-equilateral triangular lattice, an equilateral triangular lattice, a rectangular lattice, or an aperiodic lattice.

10. The AESA of claim 1, further comprising antenna elements and a radome layer disposed over a reverse surface of the PCB.

11. The AESA of claim 10, further comprising a polarizer layer disposed between the radome layer.

12. The AESA of claim 1, wherein the thermal pedestals, the TIM and the PCB together form a stack having a cross-section depth less than or equal to 100 mils (2.54 millimeter).

13. The AESA of claim 1, wherein the thermal pedestals are of a unitary, one-piece construction.

14. The AESA of claim 1, wherein the interconnecting comprises a web interconnecting a plurality of the thermal pedestals.

15. The AESA of claim 1, wherein a portion of some of the thermal pedestals encircles, without contacting, a respective one of the TRMs.

16. The AESA of claim 1, wherein the AESA is configured to operate in Ku and X frequency bands.

17. The AESA of claim 1, wherein an upper limit of the Tx and Rx frequency bands is less than or equal to 14.5 GHz and resonance frequencies are suppressed below 16 GHz.

18. The AESA of claim 1, wherein the AESA is configured to operate with a scan angle θ from 0° to 45° and a φ scan angle from 0° and 360°.

19. The AESA of claim 1, wherein an upper end of the Tx/Rx frequency band of less than or equal to 14.5 GHz with a scan angle θ from 0° to 45° and a φ scan angle from 0°≤φ≤360°.

20. An AESA (Active Electronically Scanned Array), comprising:

a PCB (Printed Circuit Board) substrate having an obverse surface;

TRMs (Transmit/Receive Modules) disposed on the obverse surface;

thermal pedestals wherein each thermal pedestal comprises a wall, having a wall height, comprising wall surfaces and one of the wall surfaces being a contact surface;

a TIM (Thermal Interface Material), having a TIM height, disposed between a respective contact surface of the thermal pedestals and the obverse surface; and a heat sink comprising fins, wherein a plurality of the thermal pedestals is physically interconnected, the TIM is electrically and thermally conductive, the wall height plus the TIM height are sufficient to suppress resonances of the TRMs below a frequency greater than the Tx and Rx frequency bands of the TRMs, the thermal pedestals extend from the heat sink, the fins extend from a first surface of the heat sink and the thermal pedestals extend from a second surface of the heat sink different than the first surface of the heat sink, the heat sink, the fins and the thermal pedestals are of a unitary, one-piece construction, and an upper limit of the Tx and Rx frequency bands less than or equal to 14.5 GHz with a scan angle θ from 0° to 45° and a φ scan angle from 0°≤φ≤360°.

* * * * *